US010165717B2

(12) United States Patent
Ohashi et al.

(10) Patent No.: US 10,165,717 B2
(45) Date of Patent: Dec. 25, 2018

(54) COMPONENT MOUNTING DEVICE

(71) Applicant: FUJI CORPORATION, Chiryu (JP)

(72) Inventors: Hiroyasu Ohashi, Toyota (JP); Hiroki Murase, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 247 days.

(21) Appl. No.: 14/912,457

(22) PCT Filed: Aug. 26, 2013

(86) PCT No.: PCT/JP2013/072782
§ 371 (c)(1),
(2) Date: Feb. 17, 2016

(87) PCT Pub. No.: WO2015/029123
PCT Pub. Date: Mar. 5, 2015

(65) Prior Publication Data
US 2016/0205820 A1     Jul. 14, 2016

(51) Int. Cl.
*H05K 13/04* (2006.01)
*H05K 13/02* (2006.01)
*H05K 13/08* (2006.01)

(52) U.S. Cl.
CPC ....... *H05K 13/0417* (2013.01); *H05K 13/021* (2013.01); *H05K 13/0408* (2013.01); *H05K 13/0452* (2013.01); *H05K 13/08* (2013.01)

(58) Field of Classification Search
CPC ........ H05K 13/00; H05K 13/02; H05K 13/04; H05K 13/08; H05K 13/021; H05K 13/0408; H05K 13/0417; H05K 13/0452
See application file for complete search history.

(56) References Cited

U.S. PATENT DOCUMENTS 6,694,606 B1    2/2004 Ohashi et al.
7,017,263 B2 *  3/2006 Yanagida ........... H05K 13/0417
                                                    29/739

(Continued)

FOREIGN PATENT DOCUMENTS

JP      01-155698 A     6/1989
JP    2005-101586 A     4/2005

(Continued)

OTHER PUBLICATIONS

International Search Report dated Oct. 15, 2013, in PCT/JP2013/072782 Filed Aug. 26, 2013.

(Continued)

*Primary Examiner* — Carl Arbes
(74) *Attorney, Agent, or Firm* — Oblon, McClelland, Maier & Neustadt, L.L.P.

(57) ABSTRACT

A component mounting device which improves pickup accuracy of a component without delaying cycle time. A feeder which is capable of continuously feeding a first carrier tape and a second carrier tape to a component supply position without splicing, identification device for imaging a component which is a first component after switching from the first carrier tape to the second carrier tape using the imaging device and identifying a center position of the component before picking up the component, and correction control device for subjecting the X-axis slide to positional correction based on the identification carried out by the identification device such that the suction nozzle picks up the component at the center of the component.

3 Claims, 15 Drawing Sheets

(56) References Cited

U.S. PATENT DOCUMENTS

| | | | |
|---|---|---|---|
| 8,099,860 B2* | 1/2012 | Watanabe | H05K 13/0413 |
| | | | 29/709 |
| 8,156,642 B2* | 4/2012 | Maenishi | H05K 1/0269 |
| | | | 29/830 |
| 2003/0219330 A1 | 11/2003 | Lyndaker et al. | |
| 2004/0078962 A1 | 4/2004 | Ohashi et al. | |
| 2005/0005435 A1 | 1/2005 | Yanagida | |
| 2008/0201940 A1* | 8/2008 | Watanabe | H05K 13/0413 |
| | | | 29/740 |
| 2008/0214140 A1 | 9/2008 | Caveney et al. | |
| 2010/0239401 A1 | 9/2010 | Kim | |
| 2011/0255611 A1 | 10/2011 | Caveney et al. | |

FOREIGN PATENT DOCUMENTS

| | | | |
|---|---|---|---|
| JP | 2005101586 A * | 4/2005 | |
| JP | 2005-539370 A | 12/2005 | |
| JP | 2007-067187 A | 3/2007 | |
| JP | 2010-212681 A | 9/2010 | |
| JP | 2011-171664 A | 9/2011 | |
| WO | 2003/101172 A1 | 12/2003 | |

OTHER PUBLICATIONS

Extended European Search Report dated Mar. 31, 2017 in Patent Application No. 13892745.4.

* cited by examiner

A-A cross section

B-B cross section

C-C cross section

FIG. 12
(A)
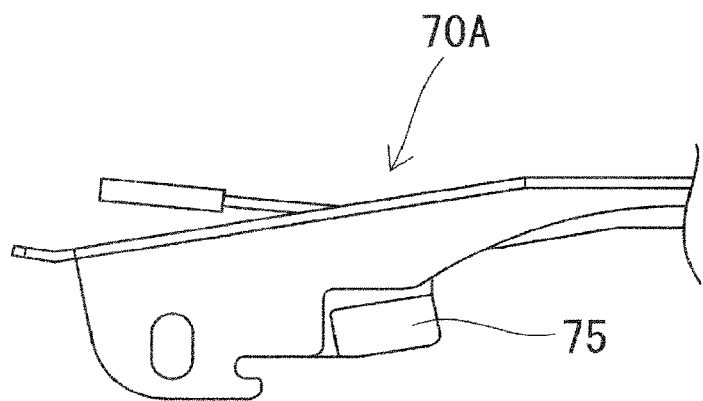
(B)
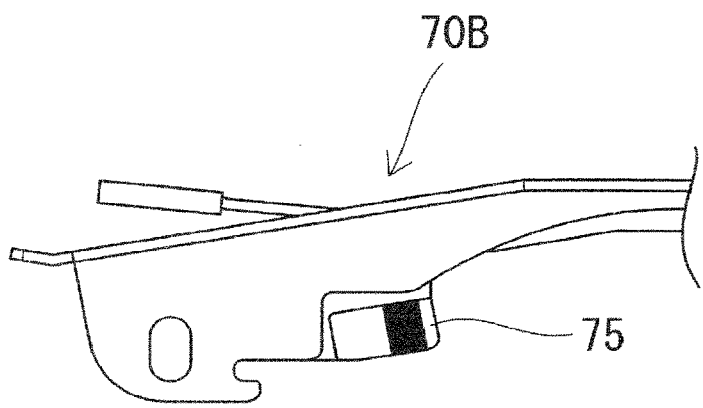
(C)
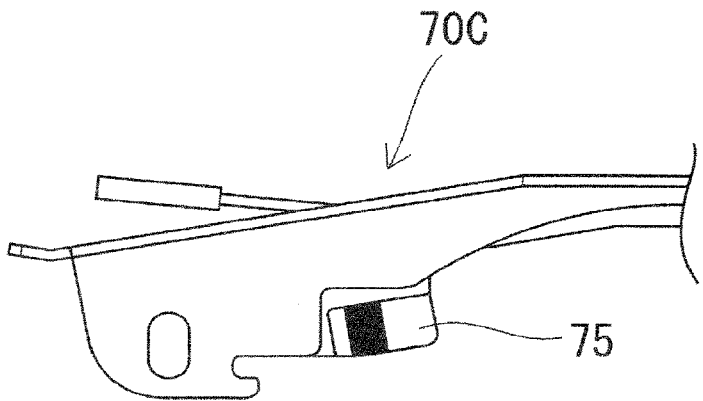

COMPONENT MOUNTING DEVICE

TECHNICAL FIELD

The present application relates to a component mounting device which is provided with a feeder capable of continuously feeding a first carrier tape and a second carrier tape to a component supply position without splicing.

BACKGROUND ART

In component mounting devices, multiple feeders are set in a component supply section, and carrier tape is fed by the feeders such that multiple components which are stored in the carrier tape are continuously fed to a component supply position. In this type of component mounting device, in order for a suction nozzle to accurately pick up a component which is supplied to the component supply position, it is necessary to accurately position the component to be supplied to the component supply position at a target position.

In recent years, as described in PTL 1 for example, feeders capable of continuously feeding a first carrier tape and a second carrier tape to a component supply position without splicing have been developed; in such feeders, when supplying components using the first carrier tape is completed, supplying is switched to the second carrier tape, thus it is possible to continue supplying components.

CITATION LIST

Patent Literature

PTL 1: JP-A-2011-171664

SUMMARY

Problem to be Solved

However, when the carrier tape is switched from the first carrier tape to the second carrier tape, due to individual differences between the carrier tapes and so on, the position of the component being fed by the second carrier tape may be shifted slightly in relation to the target position. Therefore, there are cases in which, although it was possible for the suction nozzle to pick up a component at the center position thereof for a component fed by the first carrier tape, it is not possible to pick up a component at the center position thereof after switching to the second carrier tape.

In this case, although it is possible to improve the pickup accuracy of the components if the components which are supplied to the component supply position are image processed every time before pickup, a new problem arises in that the cycle time is increased due to the image processing, thus reducing the component mounting efficiency.

The present application was made to solve the problems described above, and an object thereof is to provide a component mounting device capable of improving the pickup accuracy of components without lengthening cycle time.

Means for Solving the Problem

In order to solve the problems described above, according to one aspect of the disclosure, is characterized by a component mounting device which includes a feeder which is detachably mounted to a base and is capable of continuously feeding a first carrier tape and a second carrier tape to a component supply position without splicing, a moving body capable of moving in an XY plane in relation to the base, a component mounting head which is supported by the moving body and holds a suction nozzle which picks up a component which is supplied to the component supply position, an imaging device which is supported by the moving body and images the component which is supplied to the component supply position, identification means that images a component which is the first component after switching from the first carrier tape to the second carrier tape using the imaging device and identifying a center position of the component before picking up the component, and correction control means that subjects the moving body to positional correction based on the identification performed by the identification means such that the suction nozzle picks up the component at the center position of the component.

According to another aspect of the disclosure, further including a detection sensor which detects switching from the first carrier tape to the second carrier tape, in which an imaging start command is output to the imaging device when the second carrier tape has been fed by a fixed amount from the switching position detected by the detection sensor.

According to another aspect of the disclosure, in which imaging of the component by the imaging device is performed at least one time at an intermediate position of the second carrier tape in addition to before picking up the first component after switching from the first carrier tape to the second carrier tape.

Effects

According to the disclosure according to an aspect, since imaging of the component by the imaging device, identification of the center position of the component, and positional correction of the moving body are performed before picking up the first component after switching from the first carrier tape to the second carrier tape such that the component is picked up at the center position of the component, it is possible to correct the positional shifting caused by individual differences between the carrier tapes, thus it becomes possible for the suction nozzle to accurately pick up the component at the center position of the component. Accordingly, it is possible to reduce pickup errors without significantly increasing the cycle time.

According to the disclosure according to another aspect, since an imaging start command is output to the imaging device when the second carrier tape has been fed by a fixed amount from the switching position detected by the detection sensor which detects the switching from the first carrier tape to the second carrier tape, it is possible to automatically position the first component which is stored in the second carrier tape in the component supply position using the detection sensor.

According to the disclosure according to another aspect, since imaging of the component by the imaging device is performed at least one time at an intermediate position of the second carrier tape in addition to before picking up the first component after switching from the first carrier tape to the second carrier tape, even if there is variation in the load of pulling out the carrier tape caused by differences in the remaining amount of components, it is possible for the suction nozzle to accurately pick up the component at the center position of the component regardless of positional shifting or the like caused by the variation in load.

BRIEF DESCRIPTION OF DRAWINGS

FIG. 12 is a diagram illustrating multiple types of tape peeling units.

DESCRIPTION OF EMBODIMENTS (Component Mounting Device)

Figure 1:
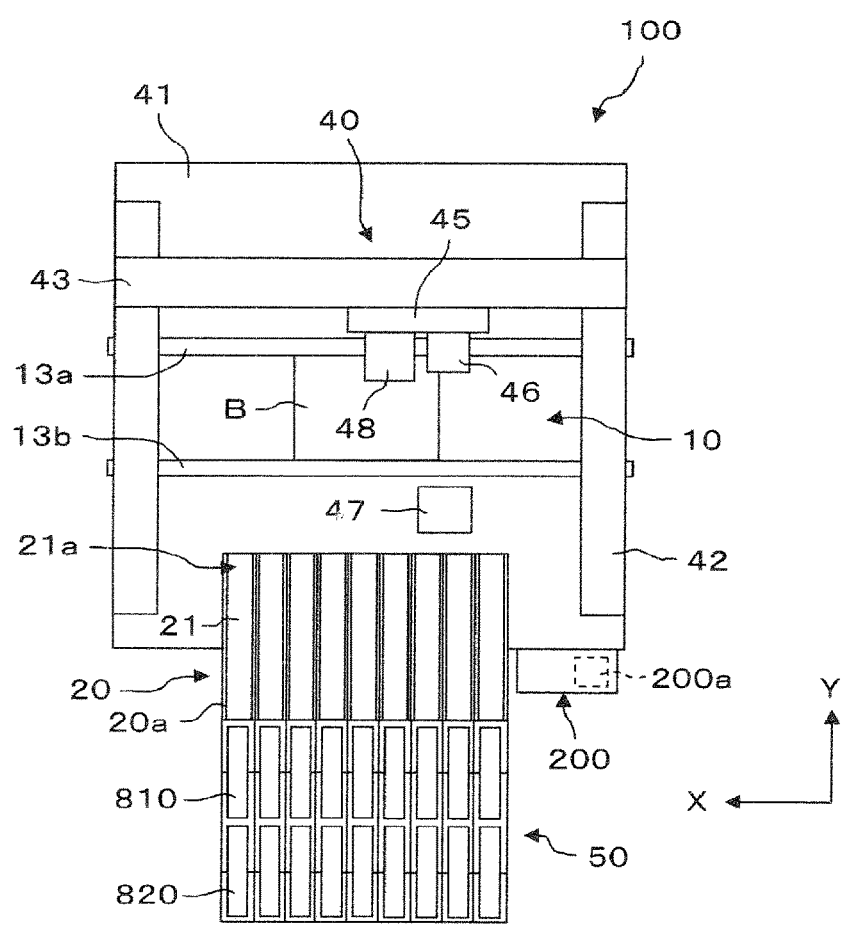
FIG. 1 is an overall plan view of a component mounting device illustrating an embodiment of the present disclosure.

Hereinafter, description will be given of component mounting device 100 which is provided with feeders 21 of the present embodiment using FIG. 1. In the description, a conveyance direction of a printed circuit board will be referred to as an X-axis direction, a direction perpendicular to the X-axis direction in a horizontal plane will be referred to as a Y-axis direction, and a direction which is perpendicular to the X-axis direction and the Y-axis direction will be referred to as a Z-axis direction.

Note that, hereinafter, to facilitate description, in order to distinguish between carrier tape which is being fed and carrier tape which is standing by, there are cases in which the former is referred to as a first carrier tape and the latter is referred to as a second carrier tape. In these cases, since the second carrier tape becomes the first carrier tape after all of the components which are stored in the first carrier tape are used, the terms first carrier tape and second carrier tape do not indicate a specific carrier tape.

According to the present embodiment, component mounting device 100 includes board conveyance device 10, component supply section 20, component mounting device 40, reel holding section 50, and control device 200 which controls these.

Component supply section 20 is formed from multiple slots 20a and multiple feeders 21 which are detachably mounted to each of the slots 20a. Slots 20a are provided in component supply section 20 lined up in parallel in the X-axis direction.

Reel holding section 50 holds, in an exchangeable manner, first reel 810 and second reel 820 on which carrier tapes 900 are wound. First reel 810 and second reel 820 are arranged adjacent to each other in the Y direction, and multiple of the reels are arranged in the X direction corresponding to each of the feeders 21.

Figure 2:
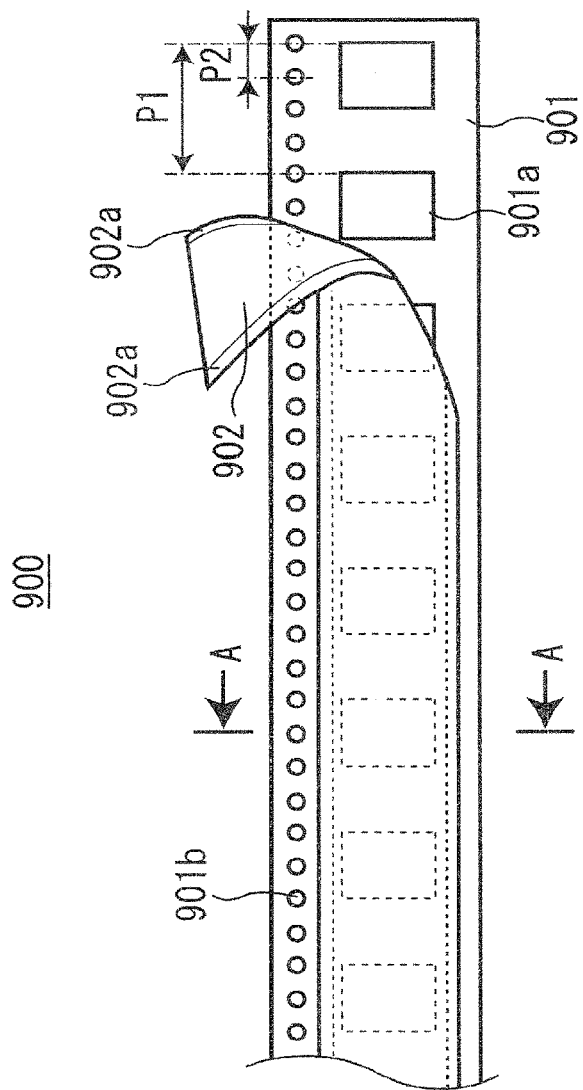
FIG. 2 is a top view of a carrier tape.
Figure 3:
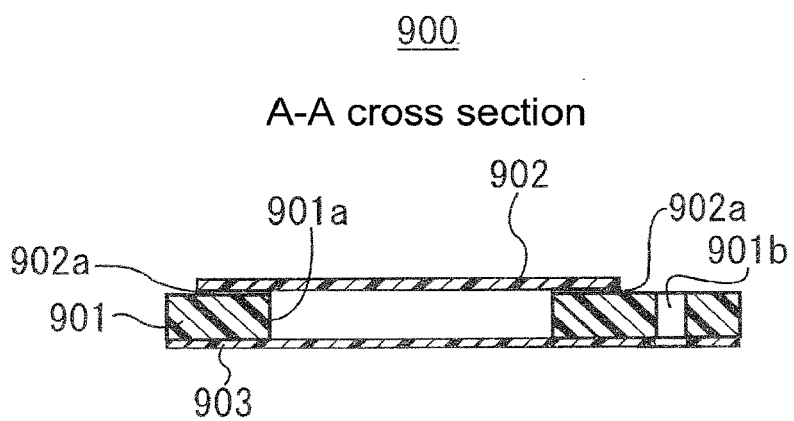
FIG. 3 is an A-A sectional diagram of the carrier tape illustrated in FIG. 2.

Carrier tape 900 stores many components such as electronic components in a row. As shown in FIG. 2 and FIG. 3, carrier tape 900 is formed of base tape 901, cover tape 902, and bottom tape 903. Base tape 901 is formed of a flexible material such as a paper material or a resin. Storage sections 901a, which are cavities, are formed as through-holes in a center portion of base tape 901 in the width direction at a fixed interval in the length direction. Components are stored in storage sections 901a. Engagement holes 901b are formed as through-holes in a side portion of the base tape 901 at a fixed interval in the length direction.

Both side portions of cover tape 902 are adhered to both side portions of the top surface of base tape 901 using an adhesive 902a (refer to FIG. 3). Cover tape 902 is formed of a transparent polymer film.

As illustrated in FIG. 3, bottom tape 903 is adhered to the bottom surface of base tape 901. Components which are stored in storage sections 901a are prevented from falling out by bottom tape 903. Bottom tape 903 is formed of a paper material, a polymer film or the like and is transparent or semi-transparent.

Carrier tape 900 which is wound on first reels 810 and second reels 820 is inserted into each of the corresponding feeders 21. Carrier tape (first carrier tape) 900 which is wound on one of the reels 810 (820) is sequentially supplied to component supply position 21a which is provided on a tip portion of feeder 21 by feeder 21. Accordingly, components held in carrier tape 900 are supplied to component supply position 21a. Although carrier tape (second carrier tape) 900 which is wound on the other reel 820 (810) is inserted into feeder 21, this carrier tape 900 stands by without being supplied by feeder 21. Detailed description of feeder 21 will be given later.

In board conveyance device 10, a pair of guide rails 13a and 13b are provided respectively on base 41 of component mounting device 40. Also, a pair of conveyor belts which support and convey a printed circuit board B which is guided by both of the guide rails 13a and 13b and which are omitted from the drawings are provided in board conveyance device 10. Also, a clamp device which holds up and clamps the printed circuit board B which is conveyed to a predetermined position and which is omitted from the drawings is provided inboard conveyance device 10.

Printed circuit board B on which components are mounted is conveyed in the X-axis direction to a component mounting position by the conveyor belts while being guided by guide rails 13a and 13b of board conveyance device 10. Printed circuit board B which is conveyed to the component mounting position is positioned and clamped in the component mounting position by the clamp device.

As illustrated in FIG. 1, component mounting device 40 includes guide rail 42, Y-axis slide 43, X-axis slide 45, and component mounting head 48 which holds a suction nozzle which is not depicted in the drawings. The movement of Y-axis slide 43 and X-axis slide 45 in the Y-axis direction and the X-axis direction is controlled by a Y-axis servo motor and an X-axis servo motor which are omitted from the drawings.

A Y-axis robot is formed by guide rail 42 and Y-axis slide 43. Guide rail 42 is mounted in the Y-axis direction above the base 41 and is arranged to be above board conveyance device 10. Y-axis slide 43 is provided to be capable of moving in the Y-axis direction along guide rail 42. Y-axis slide 43 is moved in the Y-axis direction via a ball screw mechanism by the Y-axis servo motor which is omitted from the drawings.

An X-axis robot is formed by X-axis slide 45. X-axis slide 45 is provided to be capable of moving in the X-axis direction on Y-axis slide 43. The X-axis servo motor which is omitted from the drawings is provided in Y-axis slide 43. X-axis slide 45 is moved in the X-axis direction via a ball screw mechanism by the X-axis servo motor. X-axis slide 45 forms a moving body capable of moving in the X-axis direction and the Y-axis direction.

Component mounting head 48 is provided on X-axis slide 45. Component mounting head 48 holds the suction nozzle (not illustrated in the drawings) in a detachable manner. The suction nozzle picks up a component which is supplied to component supply position 21a and mounts the component on the printed circuit board B which is positioned in the component mounting position by board conveyance device 10.

Board camera 46 which serves as an imaging device is attached onto X-axis slide 45, and board camera 46 images fiducial marks which are provided on the printed circuit board B which is positioned in the component mounting position, or a component or the like which is supplied to the component supply position 21a, from above, and acquires board position fiducial information, component position information, and the like.

Component camera 47 capable of imaging a component which has been picked up by the suction nozzle from beneath is provided on base 41.

(Feeder)

Figure 4:
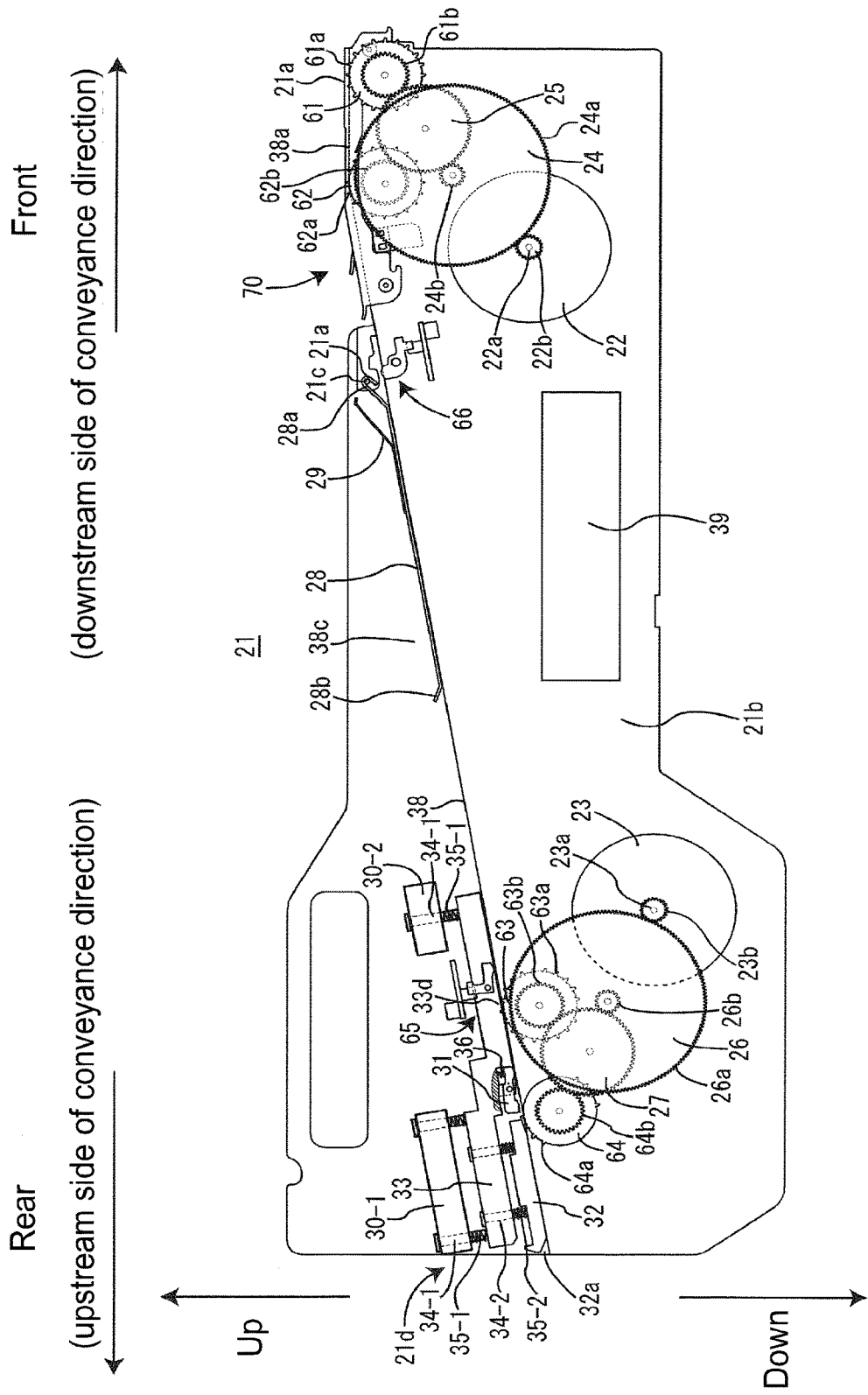
FIG. 4 is a cutaway side view of a feeder.
Figure 5:
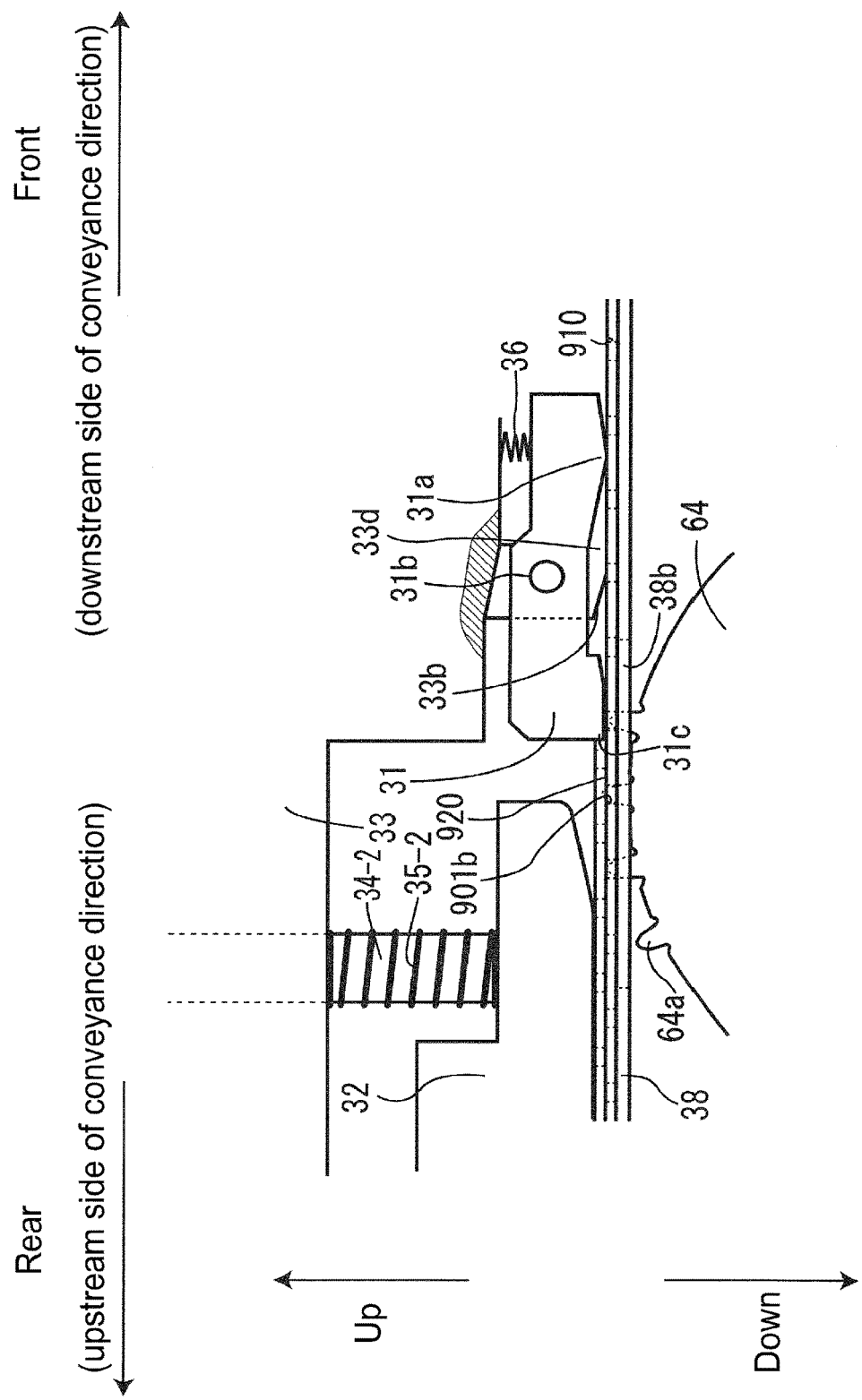
FIG. 5 is a cutaway side view representing an insertion portion of the feeder.
Figure 6:
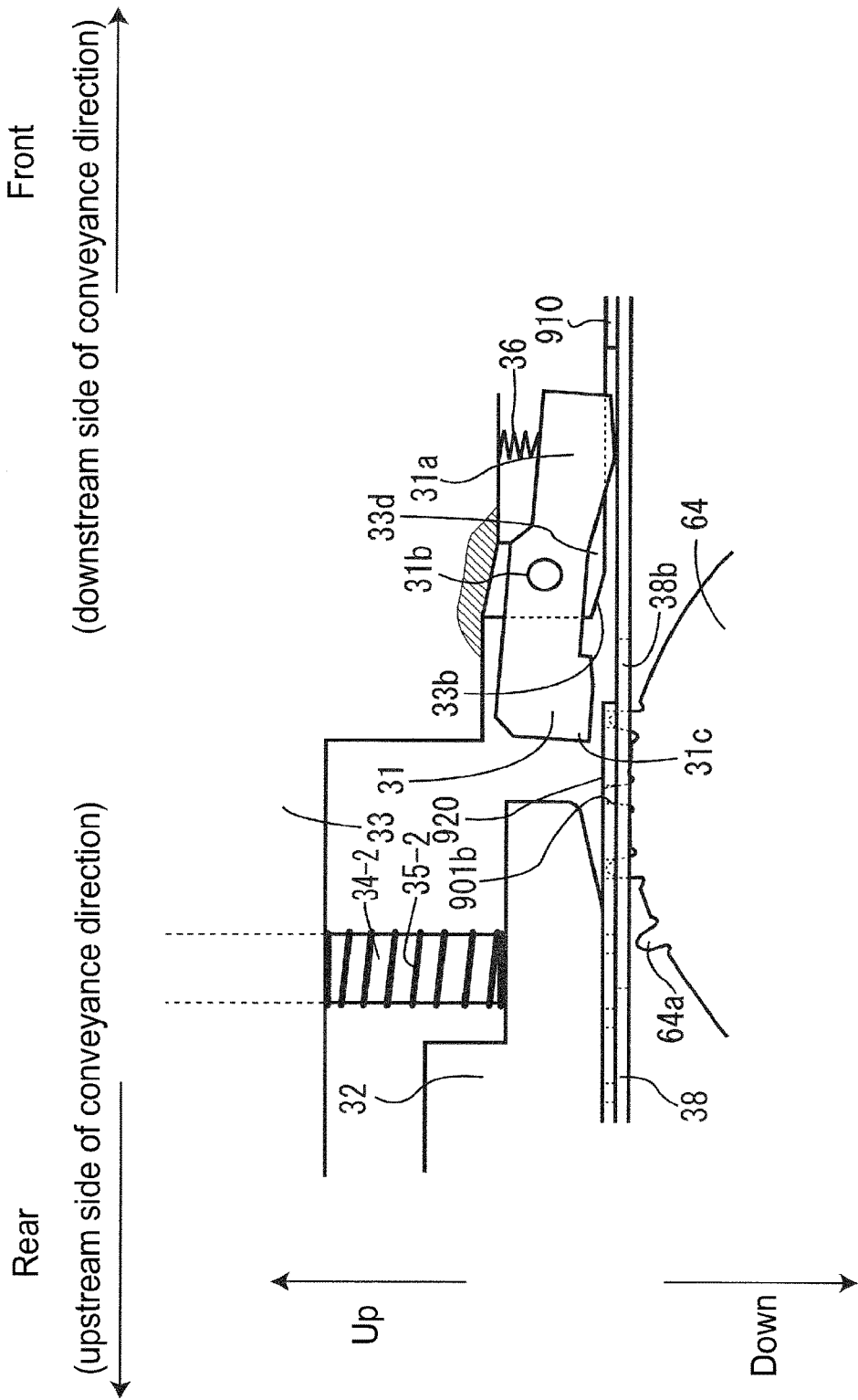
FIG. 6 is a cutaway side view representing an insertion portion of the feeder.

Hereinafter, description will be given of feeder 21 of the present embodiment using FIGS. 4 to 6. Note that, in the description hereinafter, the term "conveyance direction" indicates the conveyance direction of carrier tape 900. In FIGS. 4 to 6, the right side of the paper surface is set to the front (the downstream side in the conveyance direction) and the left side of the paper surface is set to the rear (the upstream side in the conveyance direction). In FIGS. 4 to 6, upward on the paper surface is set to upward, and downward on the paper surface is set to downward.

Feeder 21 is formed mainly of main body 21b, first servo motor 22, second servo motor 23, first gear 24, second gear 25, third gear 26, fourth gear 27, lifting prevention member 28, torsion spring 29, stopper member 31, upstream side retaining member 32, downstream side retaining member 33, first sprocket 61, second sprocket 62, third sprocket 63, fourth sprocket 64, rail 38, control section 39, and tape peeling unit 70.

Feeder 21 is mounted by being inserted into slot 20a from the front. Main body 21b is a flat box shape. Note that, FIGS. 4 to 6 are diagrams with a side wall of main body 21b removed to show the internal structure of feeder 21.

Rail 38 is provided from insertion section 21d at the rear section of main body 21b to component supply position 21a at the front portion of main body 21b. The top surface of rail 38 forms the conveying path of carrier tape 900. Front section 38a of rail 38 is formed horizontally. In the present embodiment, rail 38 is inclined to gradually increase in height from the rear section to before front section 38a. Note that, although not depicted in the drawings, guide members which are separated by a dimension which is slightly greater than the width dimension of carrier tape 900 are provided on both sides of rail 38.

Each of first sprocket 61 and second sprocket 62 is provided, to be capable of rotating, from the front toward the rear (from the downstream side to the upstream side in the conveyance direction) in main body 21b beneath front section 38a of rail 38, that is, in positions adjacent to the component supply position 21a of main body 21b. Each of third sprocket 63 and fourth sprocket 64 is provided, to be capable of rotating, from the front toward the rear in main body 21b beneath the rear section of rail 38. First engaging protrusions 61a, second engaging protrusions 62a, and third engaging protrusions 63a are formed at a fixed angle on the outer circumferences of first sprocket 61, second sprocket 62, and third sprocket 63, respectively. Fourth engaging protrusions 64a are formed at a fixed angle on a portion of the outer circumference of fourth sprocket 64. Each of the engaging protrusions 61a to 64a engages with engagement holes 901b of carrier tape 900.

First sprocket gear 61b, second sprocket gear 62b, third sprocket gear 63b, and fourth sprocket gear 64b are formed closer to the inside than the outer circumference of the first sprocket 61 to the fourth sprocket 64, respectively. Note that, window hole 38b (refer to FIG. 5) is provided above each of the sprockets 61 to 64 of rail 38. Each of the engaging protrusions 61a to 64a protrudes from the top of rail 38 through window holes 38b.

First servo motor 22 is a servo motor which rotates the first sprocket 61 and the second sprocket 62. First drive gear 22b is provided on rotating shaft 22a of the first servo motor 22. First gear 24 is rotatably provided on main body 21b beneath first sprocket 61 and second sprocket 62. First outside gear 24a which meshes with first drive gear 22b is formed on the outer circumference of first gear 24. First inside gear 24b is formed closer to the inside than the outer circumference of first gear 24.

Second gear 25 is rotatably provided on main body 21b between first sprocket 61 and second sprocket 62, and first gear 24. Second gear 25 meshes with first sprocket gear 61b, second sprocket gear 62b, and first inside gear 24b. According to this configuration, the rotation speed of first servo motor 22 is reduced and transmitted to first sprocket 61 and second sprocket 62, and, first sprocket 61 and second sprocket 62 rotate in synchronization.

Second servo motor 23 is a servo motor which rotates third sprocket 63 and fourth sprocket 64. Second drive gear 23b is provided on rotating shaft 23a of second servo motor 23. Third gear 26 is rotatably provided on main body 21b beneath third sprocket 63 and fourth sprocket 64. Third outside gear 26a which meshes with second drive gear 23b is formed on the outer circumference of third gear 26. Third inside gear 26b is formed closer to the inside than the outer circumference of third gear 26.

Fourth gear 27 is rotatably provided on main body 21b between third sprocket 63 and fourth sprocket 64, and third gear 26. Fourth gear 27 meshes with third sprocket gear 63b, fourth sprocket gear 64b, and third inside gear 26b. According to this configuration, the rotation speed of second servo motor 23 is reduced and transmitted to third sprocket 63 and fourth sprocket 64, and, third sprocket 63 and fourth sprocket 64 rotate in synchronization.

Downstream side retaining member 33 is block-shaped and is provided on insertion section 21d of main body 21b above the rear section of rail 38. Downstream side retaining member 33 is attached to first support member 30-1 and second support member 30-2, which are attached to main body 21b, via shaft 34-1 so as to be capable of moving in the vertical direction. Coil spring 35-1 which biases downstream side retaining member 33 downward is attached to shaft 34-1. Retaining section 33d which abuts rail 38 on third sprocket 63 is formed in front of the downstream side retaining member 33. According to this configuration, retaining section 33d moves toward and away from the rail 38. As illustrated in FIG. 5, penetrating section 33b is formed as a cutout on the bottom portion of the rear end of retaining section 33d.

Upstream side retaining member 32 is block-shaped and is provided along the top surface of the rear section of rail 38. Upstream side retaining member 32 is attached beneath the rear section of downstream side retaining member 33 via shaft 34-2 to be capable of moving in the vertical direction. Upstream side retaining member 32 is adjacent to the rear of retaining section 33d. Coil spring 35-2 which biases upstream side retaining member 32 downward is attached to shaft 34-2. According to this configuration, upstream side retaining member 32 moves toward and away from rail 38. Insertion recessed section 32a is formed as a cutout on the bottom portion of the rear end of upstream side retaining member 32.

As illustrated in FIG. 5, stopper member 31 is block-shaped and is provided adjacent on the downstream side of upstream side retaining member 32. Stopper member 31 is capable of rocking due to shaft support section 31b which is formed in a middle portion of stopper member 31 being axially supported by downstream side retaining member 33. Abutting section 31a which is formed to protrude downward is formed on the bottom portion of stopper member 31 which is closer to the front than the shaft support portion 31b. The rear end of the bottom section of stopper member 31 is stopping section 31c.

Spring 36 which biases stopper member 31 in a direction in which abutting section 31a approaches rail 38 is attached to downstream side retaining member 33. As illustrated in FIG. 5, in relation to the conveyance direction, the apex section of fourth sprocket 64 is positioned between the front end of downstream side retaining member 33 and the rear end of stopper member 31.

As illustrated in FIG. 4, lifting prevention member 28 is plate-shaped and is provided along the top of rail 38 between the third sprocket 63 and the second sprocket 62. Shaft support portion 28a is formed on the front end of lifting prevention member 28, and shaft support portion 28a is axially supported on shaft portion 21c which is provided in main body 21b, and, lifting prevention member 28 is attached to main body 21b to be capable of rocking. Guide portion 28b which is bent upward is formed on the rear end of lifting prevention member 28. Torsion spring 29 is attached to main body 21b above lifting prevention member 28 and biases lifting prevention member 28 downward. The bottom surface of lifting prevention member 28 comes into close contact with the top surface of rail 38 due to torsion spring 29.

Note that, space 38c is formed above rail 38 between second sprocket 62 and third sprocket 63.

Control section 39 controls feeder 21 and controls the rotation of first servo motor 22 and second servo motor 23. Control section 39 includes a microprocessor and a driver which supplies the drive currents to servo motors 22 and 23.

First sensor 65 which detects the presence or absence of carrier tape 900 and outputs that detection signal to control section 39 is provided in main body 21b on the downstream side of third sprocket 63. First sensor 65 is a sensor which detects a boundary portion between conveyance tape 910 and standby tape 920 which are described later. Second sensor 66 which detects the presence or absence of carrier tape 900 and outputs that detection signal to control section 39 is provided in main body 21b on the upstream side of second sprocket 62. Description will be given of the role of second sensor 66 later.

Hereinafter, description will be given of operations of feeder 21. A worker inserts carrier tape 900 between the insertion recessed section 32a and the rear end of rail 38 which are illustrated in FIG. 4. When this is done, fourth engaging protrusions 64a engage with engagement holes 901b which are formed in the leading end of the inserted carrier tape 900, and the carrier tape 900 is conveyed to third sprocket 63 by fourth sprocket 64. Since fourth engaging protrusions 64a are only formed in a portion of the outer circumference of fourth sprocket 64, when fourth engaging protrusions 64a engage with engagement holes 901b which are formed in the leading end of the inserted carrier tape 900, carrier tape 900 moves to the third sprocket 63 side intermittently. Therefore, since carrier tape 900 is not suddenly pulled to the third sprocket 63 side, this is safe.

The leading end of carrier tape 900 which is supplied to the downstream side by fourth sprocket 64 enters below retaining section 33d from penetrating section 33b. When engagement holes 901b which are formed in the leading portion of carrier tape 900 are engaged with third engaging protrusions 63a, carrier tape 900 is conveyed to second sprocket 62 by third sprocket 63. Since third engaging protrusions 63a are formed along the entire circumference of the outer circumference of third sprocket 63, carrier tape 900 is conveyed to second sprocket 62 side in a short time. Note that, conveyance tape 910 is pushed from above by retaining section 33d such that the engagement between engagement holes 901b and third engaging protrusions 36a is not released.

The leading end of carrier tape 900 enters beneath lifting prevention member 28 from between guide section 28b and rail 38. The leading end of carrier tape 900 is suppressed from lifting up from rail 38 by lifting prevention member 28 and is conveyed to second sprocket 62.

When second sensor 66 detects the leading end of carrier tape 900 which is conveyed thereto by third sprocket 63, first servo motor 22 and second servo motor 23 intermittently rotate sprockets 61 to 64 by component pitch P1 (illustrated in FIG. 2). When engagement holes 901b which are formed on the leading end section of carrier tape 900 engage with second engaging protrusions 62a, carrier tape 900 is fed to tape peeling unit 70 by second sprocket 62 and cover tape 902 is peeled from carrier tape 900 by tape peeling unit 70. When engagement holes 901b which are formed on the leading end section of carrier tape 900 engage with first engaging protrusions 61a, components which are stored in carrier tape 900 are sequentially positioned in component supply position 21a so as to be supplied by first sprocket 61.

While conveyance tape 910 which is carrier tape 900 being conveyed is being conveyed by the feeder 21, as illustrated in FIG. 5, conveyance tape 910 presses abutting section 31a, stopper member 31c rocks in a direction acting against the biasing force of spring 36 such that stopping section 31c approaches rail 38, thus the rear-bottom end of stopper member 31 contacts the top surface of conveyance tape 910.

The worker inserts standby tape 920, which is the carrier tape 900 that stands by, between insertion recessed section 32a and conveyance tape 910. When this is done, since the rear-bottom end of stopper member 31 contacts the top surface of conveyance tape 910, the tip of standby tape 920 abuts stopping section 31c of stopper member 31, conveyance to the downstream of standby tape 920 is prevented, and standby tape 920 stands by above conveyance tape 910.

Standby tape 920 is pushed into conveyance tape 910 by upstream side retaining member 32. Therefore, lifting of the tip of standby tape 920 from conveyance tape 910 is prevented, and the entering of the tip of standby tape 920 between the front end of upstream side retaining member 32 and the rear end of stopper member 31 is prevented.

Note that, conveyance tape 910 is wound on reel 810 which is on the front side. Standby tape 920 is wound on reel 820 which is on the rear side.

As illustrated in FIG. 6, when the tail end of conveyance tape 910 is conveyed closer to the downstream side than the leading end of standby tape 920, standby tape 920 assumes a state of being on rail 38, and engagement holes 901b which are formed in the leading section of standby tape 920 are engaged with fourth engaging protrusions 64a. The leading end of carrier tape 900 which is supplied by fourth sprocket 64 enters below retaining section 33d from penetrating section 33b. When engagement holes 901b which are formed in the leading section of carrier tape 900 are engaged with third engaging protrusions 63a, carrier tape 900 is conveyed to second sprocket 62 by third sprocket 63 and is conveyed to component supply position 21a as described above.

When the leading end of carrier tape 900 which was standby tape 920 presses the abutting portion 31a, stopper member 31 rocks in a direction against the biasing force of spring 36, such that stopping portion 31c approaches the top surface of rail 38, and the rear-bottom end of stopper member 31 comes into contact with the new conveyance tape 910 (the old standby tape 920).

The worker removes the used reel 810 for which all of the conveyance tape 910 has been supplied from reel holding section 50 and causes the reel holding section 50 to hold the reel 820 on which new standby tape 920 is wound. The worker sets the new standby tape 920 by inserting the leading end of the new standby tape 920 between insertion recessed portion 32a and conveyance tape 910. As described above, since the rear-bottom end of stopper member 31 contacts the new conveyance tape 910, the tip of the new standby tape 920 abuts stopping portion 31c of stopper member 31, conveyance to the downstream of the standby tape 920 is prevented, and standby tape 920 stands by above conveyance tape 910.

(Tape Peeling Unit)

Figure 7:
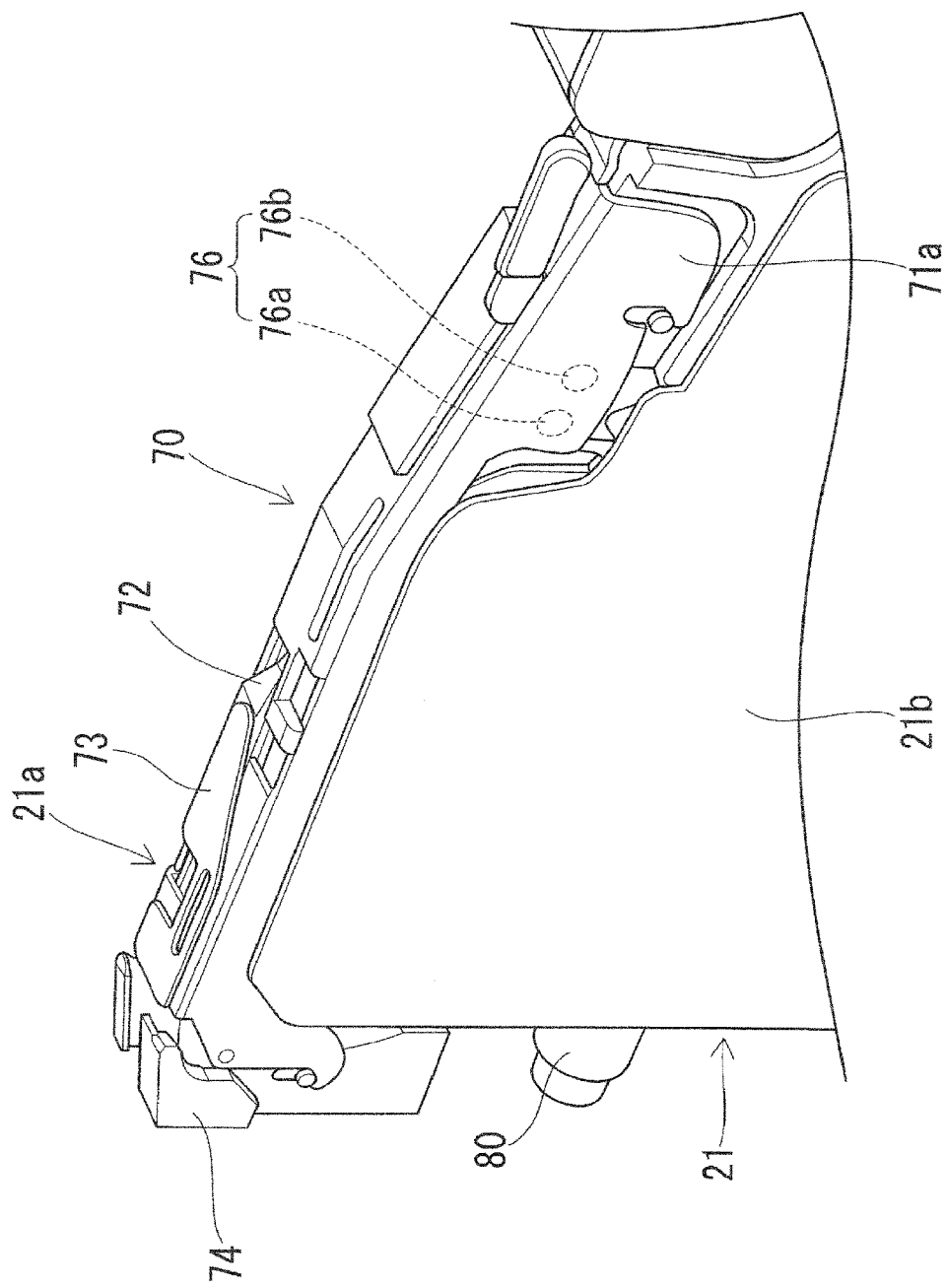
FIG. 7 is a perspective diagram of a non-splicing feeder to which a tape peeling unit is attached.
Figure 8:
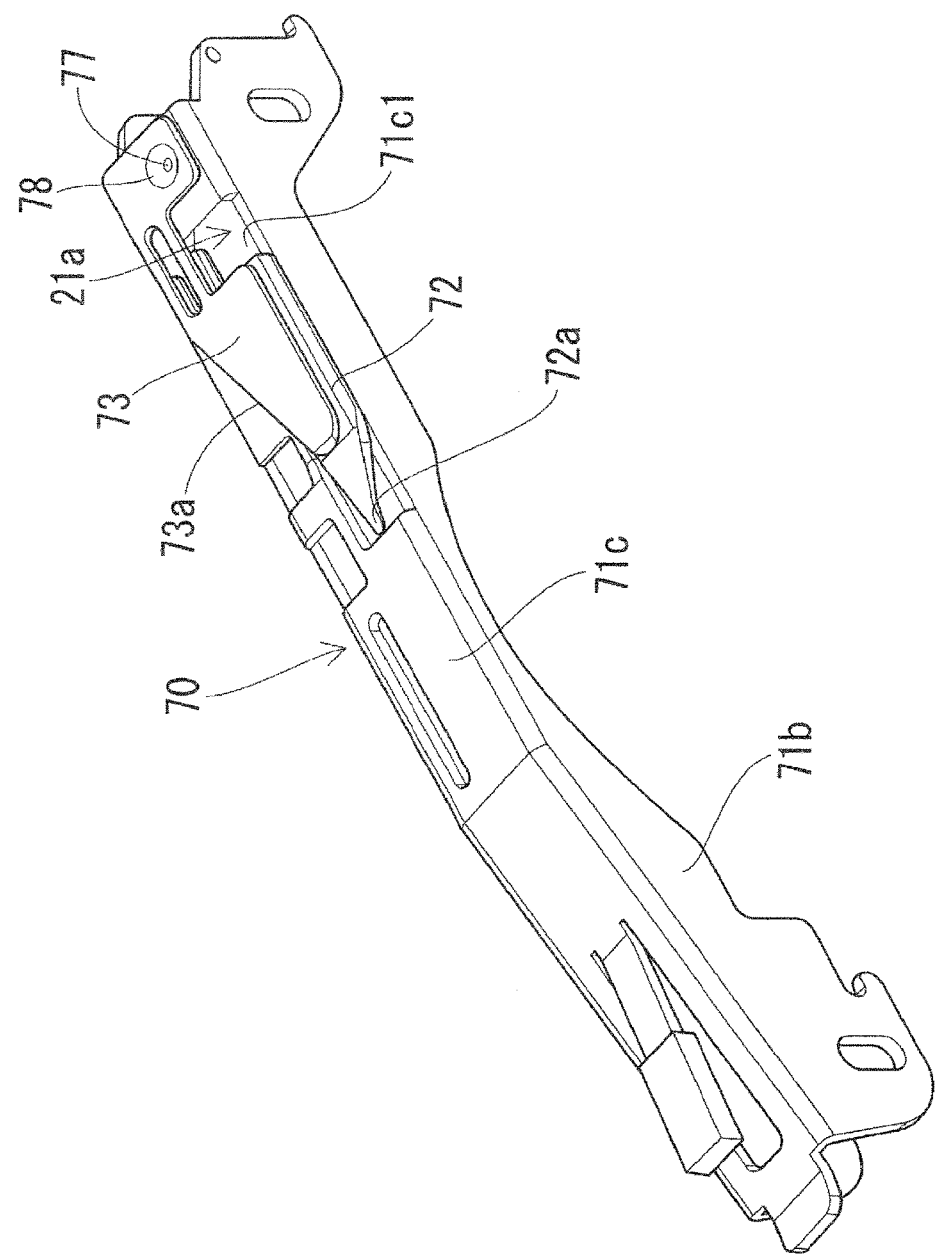
FIG. 8 is a perspective diagram illustrating the tape peeling unit in detail.
Figure 9:
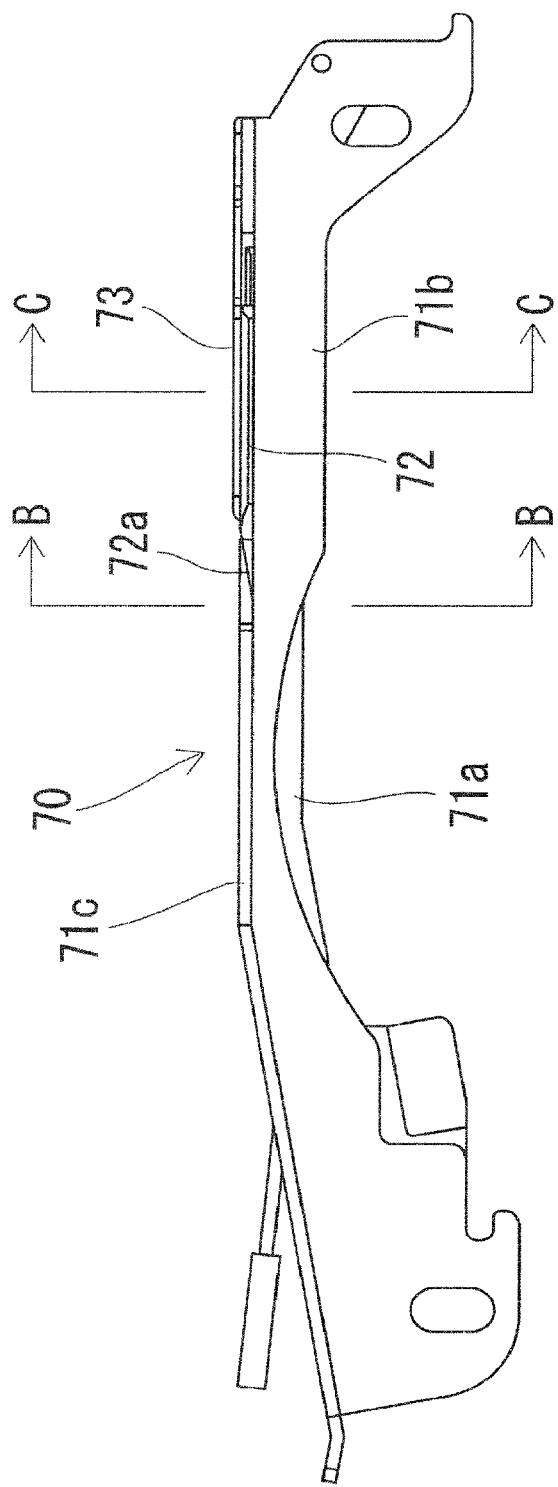
FIG. 9 is a side view of the tape peeling unit.
Figure 10:
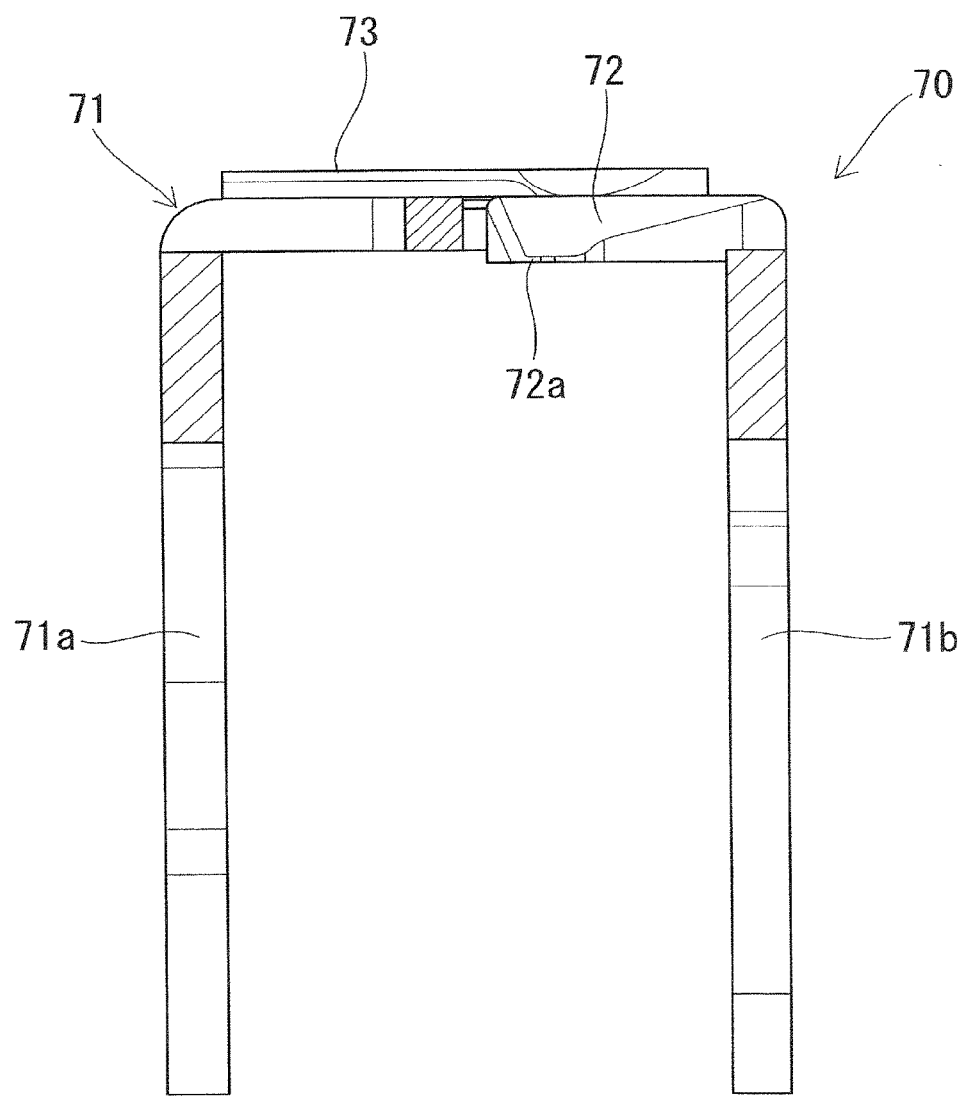
FIG. 10 is a cross-sectional diagram taken along the B-B line of FIG. 9.
Figure 11:
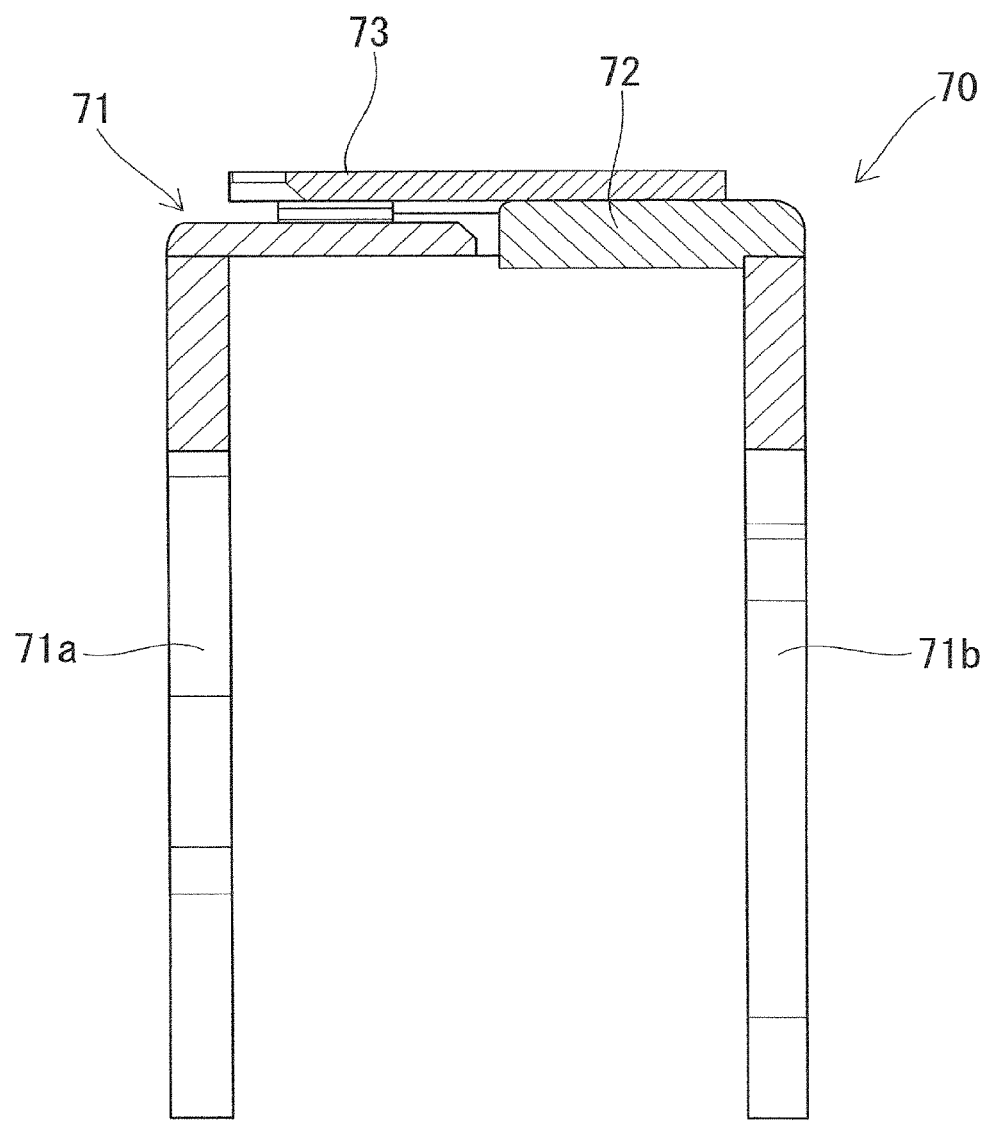
FIG. 11 is a cross-sectional diagram taken along the C-C line of FIG. 9.

Next, description will be given of the configuration of tape peeling unit 70 using FIGS. 7 to 14. As illustrated in FIG. 7, at the tip of feeder 21, tape peeling unit 70 for peeling cover tape 902 of carrier tape 900 which is fed to the component supply position 21a is fixed to main body 21b in a detachable manner.

Multiple types of tape peeling unit 70 are prepared corresponding to the types of carrier tapes 900, and a tape peeling unit 70 corresponding to the type of carrier tape 900 which is mounted in feeder 21 is attached to main body 21b. In the embodiment, as illustrated in FIG. 12, three types of tape peeling units 70A, 70B, and 70C are prepared.

As illustrated in FIGS. 8 to 11, tape peeling unit 70 includes unit main body 71 having a U-shaped cross section with a downward facing opening, the front and rear of both side walls 71a and 71b of unit main body 71 are fixed to both side surfaces of main body 21b using a fastening means such as a screw, and carrier tape 900 is guided between both of the side walls 71a and 71b. Cutout 71c1 which includes component supply position 21a is formed in a predetermined position in upper wall 71c of unit main body 71, such that it is possible to remove a component from storage section 901a of carrier tape 900.

Plate-shaped cutter member 72, which has a cutting edge 72a with a sharp tip which peels the cover tape 902 of the carrier tape 900, is fixed to upper wall 71c of unit main body 71 in a position above carrier tape 900 so as to cover cutout 71c1. Both edges of cover tape 902 are adhered to the carrier tape 900 and cutting edge 72a of cutter member 72 is provided in a position corresponding to one edge (the edge at the engagement hole 901b side) of cover tape 902. Cutting edge 72a of cutter member 72 is interposed between base tape 901 and cover tape 902 as carrier tape 900 is fed so as to peel one edge of cover tape 902 while maintaining the adhered state of the other edge of cover tape 902.

Figure 13:
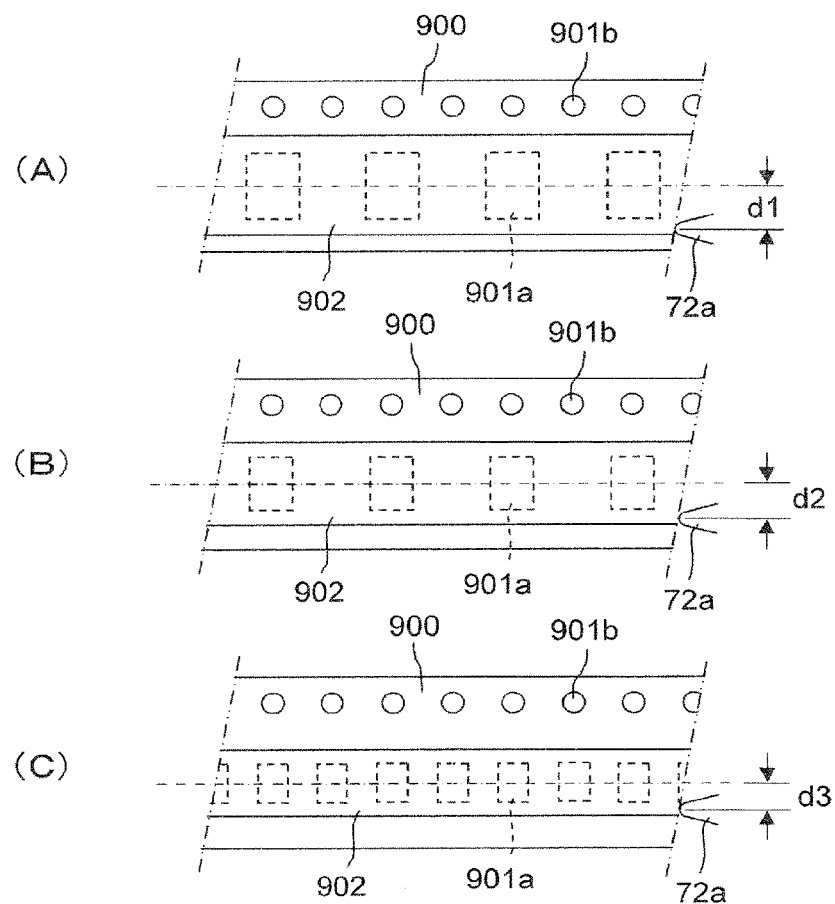
FIG. 13 is a diagram illustrating the position of the cutting edge of multiple types of cutter members.

Here, as illustrated in FIG. 13, although the multiple types of carrier tapes 900 have engagement holes 901b of the same pitch, the sizes of storage sections 901a and the components which are stored therein are different. Therefore, the width dimensions of cover tapes 902 which cover storage sections 901a also differ from each other according to the size of storage sections 901a, and the position of the one edge (the adherence position) of cover tape 902 which is peeled by cutting edge 72a of cutter member 72 differs for each type of carrier tape 900.

With the above configuration, as illustrated in FIG. 13, cutting edge 72a of cutter member 72 is positioned separated from the center of carrier tape 900 by an amount d1, d2, or d3 corresponding to one edge of cover tape 902. In this manner, the cutting edge of cutter member 72 is positioned in a different position in the width direction of each of the carrier tapes 900 based on the type of the multiple types of tape peeling units 70A, 70B, and 70C.

Also, plate-shaped fold-over member 73 which erects and folds over one of the edges of peeled cover tape 902 is fixed on upper wall 71c of unit main body 71 such that a small gap is formed between fold-over member 73 and the top surface of carrier tape 900. Inclined surface 73a which is inclined in the width direction of cover tape 902 is formed on fold-over member 73 across a predetermined length along the feeding direction of carrier tape 900. Inclined surface 73a of fold-over member 73 protrudes in the width direction of cover tape 902 in relation to cutter member 72.

Figure 14:
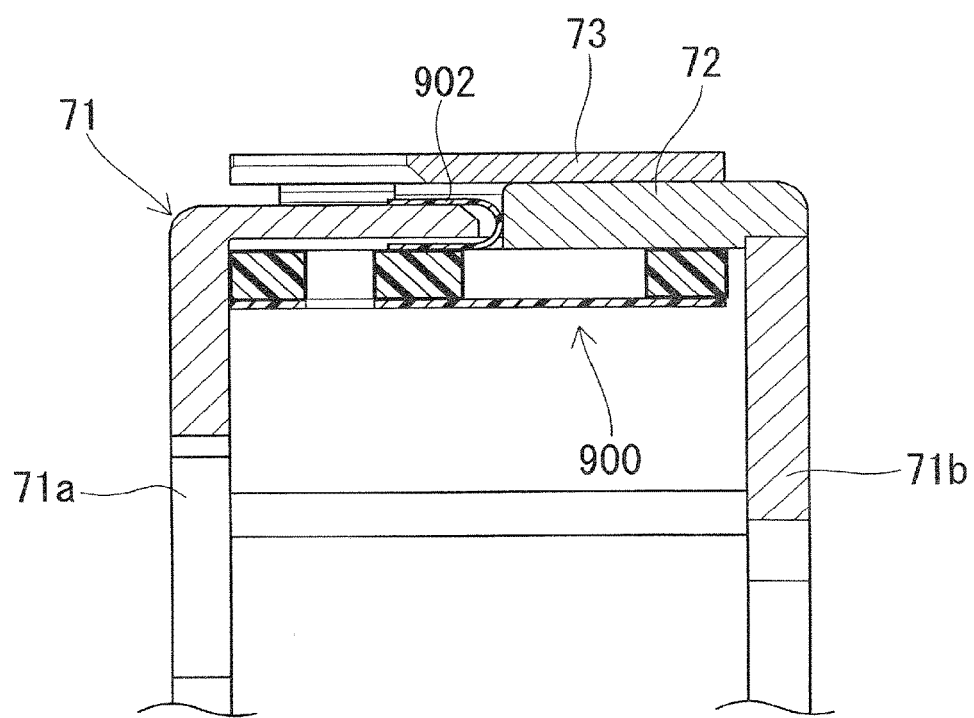
FIG. 14 is a diagram illustrating a state in which cover tape is folded over by the tape peeling unit.

Fold-over member 73 folds over one of the edges of cover tape 902 which is peeled by cutting edge 72a of cutter member 72 such that the edge of cover tape 902 is gradually erected by inclined surface 73a, thus opening (exposing) the top surface of storage section 901a in which the component which is supplied to the component supply position 21a is stored. As illustrated in FIG. 14, cover tape 902 which is folded over by inclined surface 73a of fold-over member 73 is forcefully inserted into the gap between fold-over member 73 and the top surface of carrier tape 900 (base tape 901) such that the open state of the top surface of storage section 901a is maintained.

By adopting this configuration, as with conventional art, individual collection mechanisms which fold over and collect cover tape 902 become unnecessary, and cover tape 902 becomes capable of being collected together with base tape 901 of carrier tape 900. Note that, 74 in FIG. 7 is a guide for collecting cover tape 902 and carrier tape 900, and is fixed to the tip portion of main body 21b.

In tape peeling unit 70, identification mark 75 corresponding to the type of carrier tape 900 is formed on the inside of one of the side walls 71a of unit main body 71, and identification sensor 76 which identifies identification mark 75 is attached to the side surface of main body 21b which faces the inside of the side wall 71a.

In the embodiment, for example, as illustrated in FIGS. 12 (A) to (C), codes with black and while coloring are lined up in two rows in the feeding direction of carrier tape 900 to form identification mark 75, and identification mark 75 is identified using two identification sensors 76a and 76b which are formed of two reflection sensors. The two-row code which is identified by identification sensors 76a and 76b identifies the type of the three types of tape peeling units 70 according to the combinations "white-white", "white-black", and "black-white".

Tape peeling unit 70 of the configuration described above which matches the type of carrier tape 900 to be mounted in feeder 21 is attached to main body 21b by an operator outside of the device.

Feeder 21 to which tape peeling unit 70 (70A, 70B, or 700) is attached is set in component supply section 20, power is supplied to the feeder 21 side from the main body side of component mounting device 100 via communication connector 80 (refer to FIG. 7), and necessary information such as the feeder ID is transmitted from the feeder 21 side to the main body side of component mounting device 100. Accordingly, the information of the component which is fed by carrier tape 900 which is mounted in feeder 21 is acquired based on the serial ID of feeder 21 and stored in control device 200 of component mounting device 100. At the same time, the information of the type of tape peeling unit 70 which is identified by identification sensor 76 (76a and 76b) which is provided in feeder 21 is stored in control device 200 of component mounting device 100.

Note that, feeder mark 77 indicating a reference position of feeder 21 is formed on main body 21b. For example, feeder mark 77 is formed on the top surface of the tip of feeder 21, and hole 78 is formed in upper wall 71c and fold-over member 73 of unit main body 71 which is attached to the tip portion of feeder 21 such that it is possible to image feeder mark 77 from above using board camera 46.

When feeder 21 of component supply section 20 is set, control device 200 compares the information of the component which is acquired based on the serial ID and the information which is identified by identification sensor 76 (76a and 76b) using comparison section 200a of control device 200, and, when the information does not match, that is, when it is determined that a tape peeling unit 70 which does not correspond to the carrier tape (the component) 900 which is fed by feeder 21 is attached, a warning is issued to the operator and the operator is urged to exchange the tape peeling unit 70.

Note that, in this case, a display section may be provided on the top surface of main body 21b, and the comparison result obtained by comparison section 200a may be displayed on this display section. Accordingly, the operator can identify the comparison result using the display content of the display section.

(Image Processing)

Next, based on FIG. 15, description will be given of the image processing performed by control device 200 when the carrier tape which supplies the components is switched from a first carrier tape to a second carrier tape. When the carrier tape is switched, in order to correct the individual differences between carrier tapes and shifting of components caused by the meshing of sprockets and the carrier tape, image processing is performed before picking up the first component of the second carrier tape, and the suction nozzle can accurately pick up the component at the center of the component regardless of the individual differences between the carrier tapes and the like.

Figure 15:
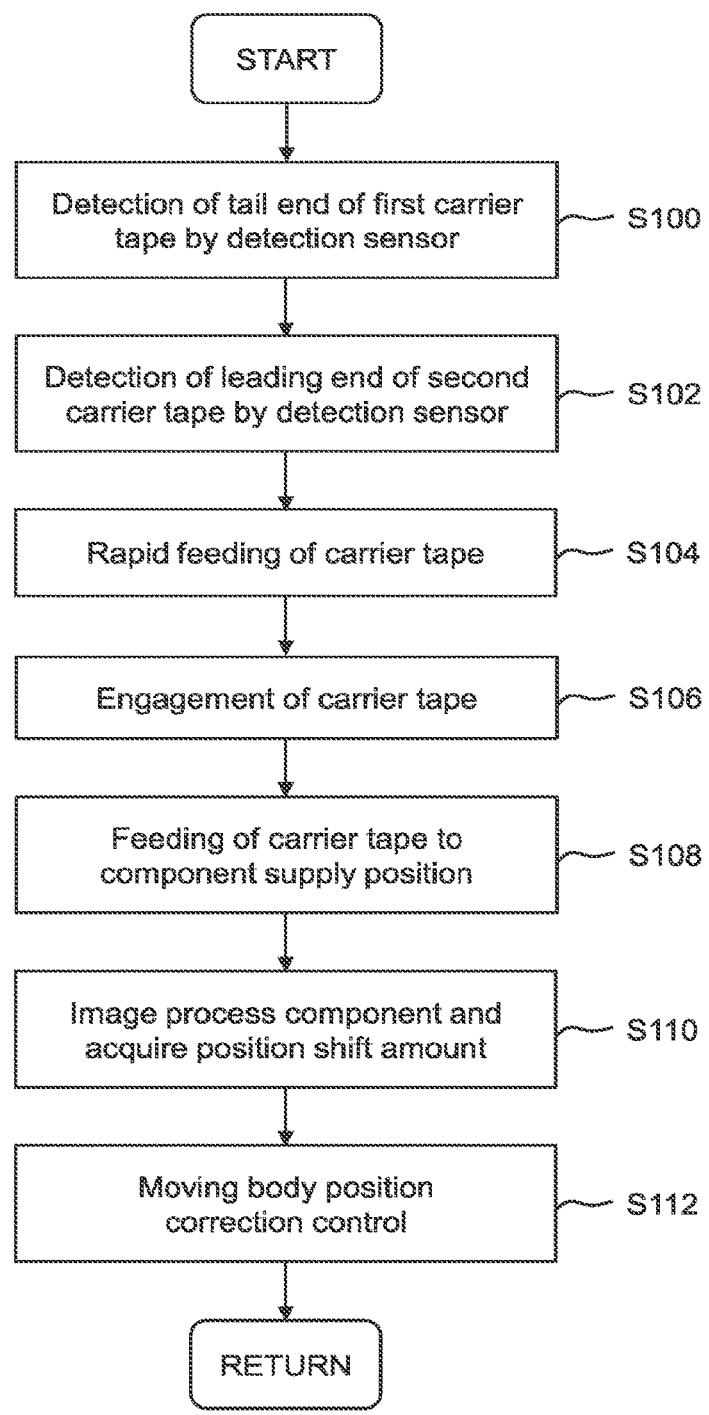
FIG. 15 is a flowchart illustrating a procedure to perform image processing on a component which is supplied to a component supply position.

In FIG. 15, when the tail end of the first carrier tape is detected by first sensor 65 which serves as the detection sensor (step S100), and the leading end of the following second carrier tape is subsequently detected by first sensor 65 (step S102), in the next step S104, the sprocket which engages with the second carrier tape is rotated rapidly by a predetermined amount, such that the leading end of the second carrier tape is fed to a point before engaging with the sprocket.

Next, in step S106, a meshing operation which causes the sprocket to mesh with engagement holes 901b of the second carrier tape is performed, the sprocket meshes with engagement holes 901b of the second carrier tape, and the sprocket is positioned at an origin point. Next, in step S108, the sprocket is rotated by a fixed amount such that the first component is supplied to component supply position 21a.

At this time, due to the sprocket being rotated by a fixed amount from the origin point position, the center position of the first component which is stored in storage section 901a of the second carrier tape should be positioned to the defined target position of component supply position 21a; however, due to the individual differences between carrier tapes 900 or the like, a case in which the center position of the component shifts in relation to the target position can occur.

In step S110, X-axis slide 45 is moved, board camera 46 is positioned in a position above component supply position 21a, the first component is imaged by board camera 46, and the center position of the component is identified using image processing. Accordingly, the shift amount ($\Delta X$ and $\Delta Y$) of the center position of the component in relation to the target position is acquired and stored in the memory of control device 200. In this case, it is possible to move X-axis slide 45 such that the board camera 46 is positioned above component supply position 21a in advance in the time before step S108.

In step S112, X-axis slide 45 is moved based on the offset amount between the center of board camera 46 and the center of the suction nozzle, and X-axis slide 45 is subjected to positional correction control by the positional shift amount ($\Delta X$ and $\Delta Y$) which is stored in the memory of control device 200. Accordingly, the center of the first component is positioned in a position which matches the target position.

In this state, the suction nozzle is lowered and the suction nozzle picks up the first component. At this time, due to the correction of the positional shift amount ($\Delta X$ and $\Delta Y$) described above, the suction nozzle reliably picks up the component at the center of the component. Subsequently, the component picked up by the suction nozzle is mounted to a predetermined position of printed circuit board B.

According to step S110 described above, identification means for imaging the component using board camera 46 and identifying the center position of the component before picking up the first component after switching from the first carrier tape to the second carrier tape is configured, and according to step S112 described above, correction control means for subjecting X-axis slide 45 to positional correction based on the identification carried out by the identification means (step S110) is configured.

Note that, since it is possible to resolve the individual differences between the first carrier tape and the second carrier tape by subjecting the center of the first component to positional correction in relation to component supply position 21a, it is possible to substantially accurately supply the second component onward to component supply position 21a based on the feeding pitch of carrier tape 900 using sprockets 61 and 62. Therefore, even if image processing of the second component onward is omitted, there is no problem.

In this manner, since the center position of the component is identified by performing image processing before picking up the first component when carrier tape 900 is switched, even if the carrier tape 900 is switched, it is possible for the suction nozzle to accurately pick up the component at the center of the component. Accordingly, it becomes possible to reduce pickup errors of the components regardless of the individual differences between carrier tapes 900.

According to the embodiment described above, since the component is imaged by the board camera 46, the center position of the component is identified, and X-axis slide 45 is subjected to positional correction before picking up the first component after switching from the first carrier tape to the second carrier tape, it is possible to correct the positional shifting caused by individual differences between carrier tapes 900 and the like.

Accordingly, since it becomes possible for the suction nozzle to accurately pick up the component at the center of the component regardless of the individual differences between carrier tapes 900 and the like, it is possible to reduce pickup errors without significantly increasing the cycle time.

According to the embodiment described above, since detection sensor (first sensor) 65 which detects the switching from the first carrier tape to the second carrier tape is provided and an imaging start command is output to board camera 46 when the second carrier tape is fed by a fixed amount from the position detected by the detection sensor 65, it is possible to automatically position the first component which is stored in the second carrier tape in component supply position 21a using detection sensor 65.

Figure 16:
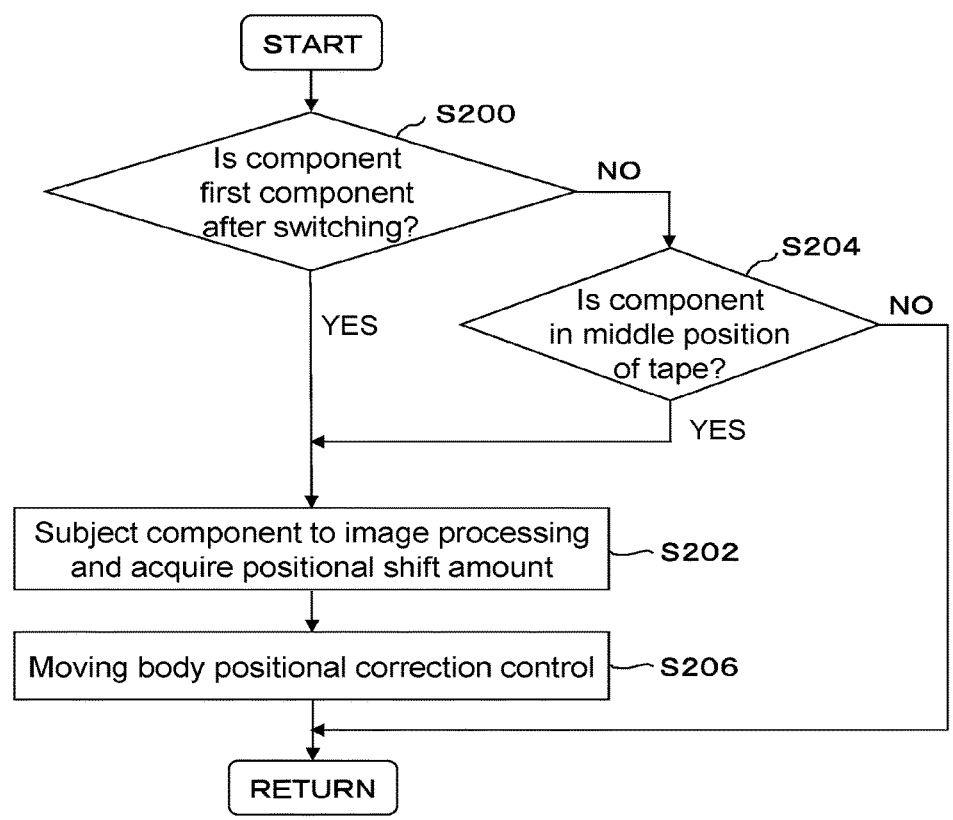
FIG. 16 is a flowchart illustrating an alternative example of FIG. 15.

FIG. 16 illustrates an alternative embodiment of the present disclosure, and although the center position is identified using board camera 46 only for the first component after switching from the first carrier tape to the second carrier tape in the embodiment described above, in the alternative embodiment, the center position of the component is identified a further one or multiple times part way through the supplying of the components (for example, at a midway position) by a single carrier tape 900.

This is because, the load of pulling out carrier tape 900 fluctuates due to changes in the remaining amount of the components which are stored in the carrier tape 900, and shifting arises in the position of the components which are supplied to component supply position 21a due to the fluctuation in the load.

In FIG. 16, according to step S200, it is determined whether the component is the first component after switching from the first carrier tape to the second carrier tape, and, when the determination result is YES, according to the subsequent step S202, image processing of the component which is supplied to the component supply position 21a is performed and the positional shift amount is acquired and stored in the memory of control device 200. When the component is not the first component, the process transitions to step S204, and in the same step S204, it is determined whether the component is the component which is stored in the middle position part way down the carrier tape 900, and, when the determination result is YES, according to step S202, image processing of the component which is supplied to component supply position 21a is performed and the positional shift amount is acquired and stored in the memory of control device 200. Subsequently, in a similar manner to the embodiment described above, in step S206, X-axis slide 45 is subjected to positional correction control.

Note that, whether the component is the component which is stored in the predetermined position in the middle of carrier tape 900 can be determined according to the remaining amount of components of the carrier tape 900 reaching a set number, or, the number of components which are stored in the carrier tape 900 which are mounted to the printed circuit board B reaching a set number, and, based thereon, the imaging start command may be output to board camera 46.

According to the alternative embodiment described above, it is possible for the suction nozzle to accurately pick up the component which is supplied to the component supply position 21a at the center of the component regardless of fluctuations in the load of pulling out carrier tape 900 caused by changes in the remaining amount of components of carrier tape 900, and further, the cycle time is not increased in comparison to a case in which the component to be picked up is image processed every time.

In the embodiments described above, description is given of an example in which feeding the first carrier tape and the second carrier tape to component supply position 21a is performed continuously without splicing by using feeder 21 which is provided with sprocket 61 (62) which feeds the component which is stored in the first carrier tape to component supply position 21a by engaging with the first carrier tape, and sprocket 63 (64) which engages the second carrier tape which is standing by and feeds the second carrier tape to a position which engages with the sprocket 61. However, for the present disclosure, the configuration of feeder 21 is not particularly limited, and any configuration may be adopted as long as feeder 21 is capable of continuously feeding the first carrier tape and the second carrier tape to component supply position 21a without splicing, such as a configuration without providing sprockets.

In this manner, the disclosure is not limited to the configuration described in the embodiments described above, and various embodiments may be adopted within a scope that does not depart from the gist of the present disclosure described in the claims.

INDUSTRIAL APPLICABILITY

A component mounting device according to the present disclosure is suitable for use as a device which is provided with a feeder capable of continuously feeding a first carrier tape and a second carrier tape to a component supply position without splicing.

REFERENCE SIGNS LIST

100 . . . component mounting device, 10 . . . board conveyance device, 20 . . . component supply section, 21 . . . feeder, 21a . . . component supply position, 40 . . . component mounting device, 41 . . . base, 45 . . . X-axis slide, 46 . . . imaging device (board camera), 48 . . . component mounting head, 65 . . . detection sensor (first sensor), step S110 . . . identification means, step S112 . . . correction control means, 900 . . . carrier tape

The invention claimed is:

1. A component mounting device, comprising:
a feeder which is detachably mounted to a base and that continuously feeds a first carrier tape and a second carrier tape to a component supply position without splicing;
a moving body capable of moving in an XY plane in relation to the base;
a component mounting head which is supported by the moving body and holds a suction nozzle which picks up a component which is supplied to the component supply position;
an imaging device which is supported by the moving body and images the component which is supplied to the component supply position;

an identification device that identifies a position of a component which is a first component of the second carrier tape when the first carrier tape is switched to the second carrier tape before picking up the component based on the imaging of the component by the imaging device; and a correction control device that determines a positional correction of the moving body based on the position of the component identified by the identification device and corrects a position of the moving body in accordance with the positional correction such that the suction nozzle picks up the component at the identified position of the component.

2. The component mounting device according to claim 1, further comprising:

a detection sensor which detects an end of the first carrier tape and a beginning of the second carrier tape, wherein an imaging start command is output to the imaging device when the second carrier tape has been fed by a fixed amount from a switching position detected by the detection sensor.

3. The component mounting device according to claim 1, wherein the identification device also identifies a midway component of the second carrier tape which is a component at a midway position of the second carrier tape and to identify a position of the midway component and the correction control device determines the positional correction of the moving body based on the identified position of the midway component.

* * * * *